(12) United States Patent
Kim

(10) Patent No.: US 7,675,585 B2
(45) Date of Patent: Mar. 9, 2010

(54) LIQUID CRYSTAL DISPLAY WITH ORGANIC EL BACKLIGHT COMPRISING CAP MEMBER WITH PROTRUSIONS

(75) Inventor: Chang Nam Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 421 days.

(21) Appl. No.: 11/182,770

(22) Filed: Jul. 18, 2005

(65) Prior Publication Data

US 2006/0012732 A1 Jan. 19, 2006

(30) Foreign Application Priority Data

Jul. 19, 2004 (KR) .................. 10-2004-0055918

(51) Int. Cl.
*G02F 1/1333* (2006.01)
*G02F 1/1335* (2006.01)

(52) U.S. Cl. .......................... 349/69; 349/58

(58) Field of Classification Search ............. 349/58–71; 361/681; 362/31, 600–634; 385/146, 901
See application file for complete search history.

(56) References Cited

U.S. PATENT DOCUMENTS

| | | | |
|---|---|---|---|
| 5,882,761 A * | 3/1999 | Kawami et al. ............... 428/69 |
| 6,551,724 B2 * | 4/2003 | Ishii et al. ................... 428/690 |
| 6,825,612 B2 * | 11/2004 | Lai ............................ 313/512 |
| 6,833,668 B1 * | 12/2004 | Yamada et al. .............. 313/505 |
| 6,855,961 B2 * | 2/2005 | Maruyama et al. ........... 257/99 |
| 6,870,197 B2 * | 3/2005 | Park et al. .................... 257/98 |
| 7,019,455 B2 * | 3/2006 | Fukuoka et al. ............. 313/504 |
| 7,023,133 B2 * | 4/2006 | Omura ........................ 313/512 |
| 2001/0002145 A1 * | 5/2001 | Lee et al. .................... 349/58 |
| 2002/0101729 A1 * | 8/2002 | Hayashi et al. .............. 362/84 |
| 2003/0058380 A1 * | 3/2003 | Kim et al. .................... 349/58 |
| 2003/0102801 A1 * | 6/2003 | Senbonmatsu ............. 313/506 |
| 2004/0213018 A1 * | 10/2004 | Torihara ...................... 362/561 |
| 2005/0237780 A1 * | 10/2005 | Sakai .......................... 365/111 |

FOREIGN PATENT DOCUMENTS

| | | |
|---|---|---|
| EP | 0500382 | 8/2002 |
| JP | 3-20317 | 7/1989 |
| JP | 9-63766 | 3/1997 |
| JP | 09063766 A * | 3/1997 |
| JP | 10-125463 | 5/1998 |

(Continued)

OTHER PUBLICATIONS

Chinese Office Action dated May 25, 2007.

(Continued)

*Primary Examiner*—David Nelms
*Assistant Examiner*—Jessica M Merlin
(74) *Attorney, Agent, or Firm*—KED & Associates LLP

(57) ABSTRACT

A liquid crystal display and fabricating method thereof are disclosed, by which a backlight having a simple configuration, a reduced thickness and a low cost can be provided. The present invention includes a liquid crystal display panel having an upper substrate, a lower substrate and liquid crystals between the upper and lower substrates, an organic EL device provided under the lower substrate of the liquid crystal display panel to provide light to the liquid crystal display panel, and a cap boned to at least one of the lower substrate of the liquid crystal display panel and a substrate of the organic EL device to protect the organic EL device.

30 Claims, 7 Drawing Sheets

FOREIGN PATENT DOCUMENTS

| | | | |
|---|---|---|---|
| JP | 2000-241811 | | 9/2000 |
| JP | 2001068271 A | * | 3/2001 |
| JP | 2002072207 A | * | 3/2002 |
| JP | 2002-98956 | | 4/2002 |
| JP | 2002098956 A | * | 4/2002 |
| JP | 2002-156633 | | 5/2002 |
| KR | 10-0366526 | | 12/2002 |

OTHER PUBLICATIONS

Japanese Office Action dated Jun. 3, 2009.

* cited by examiner

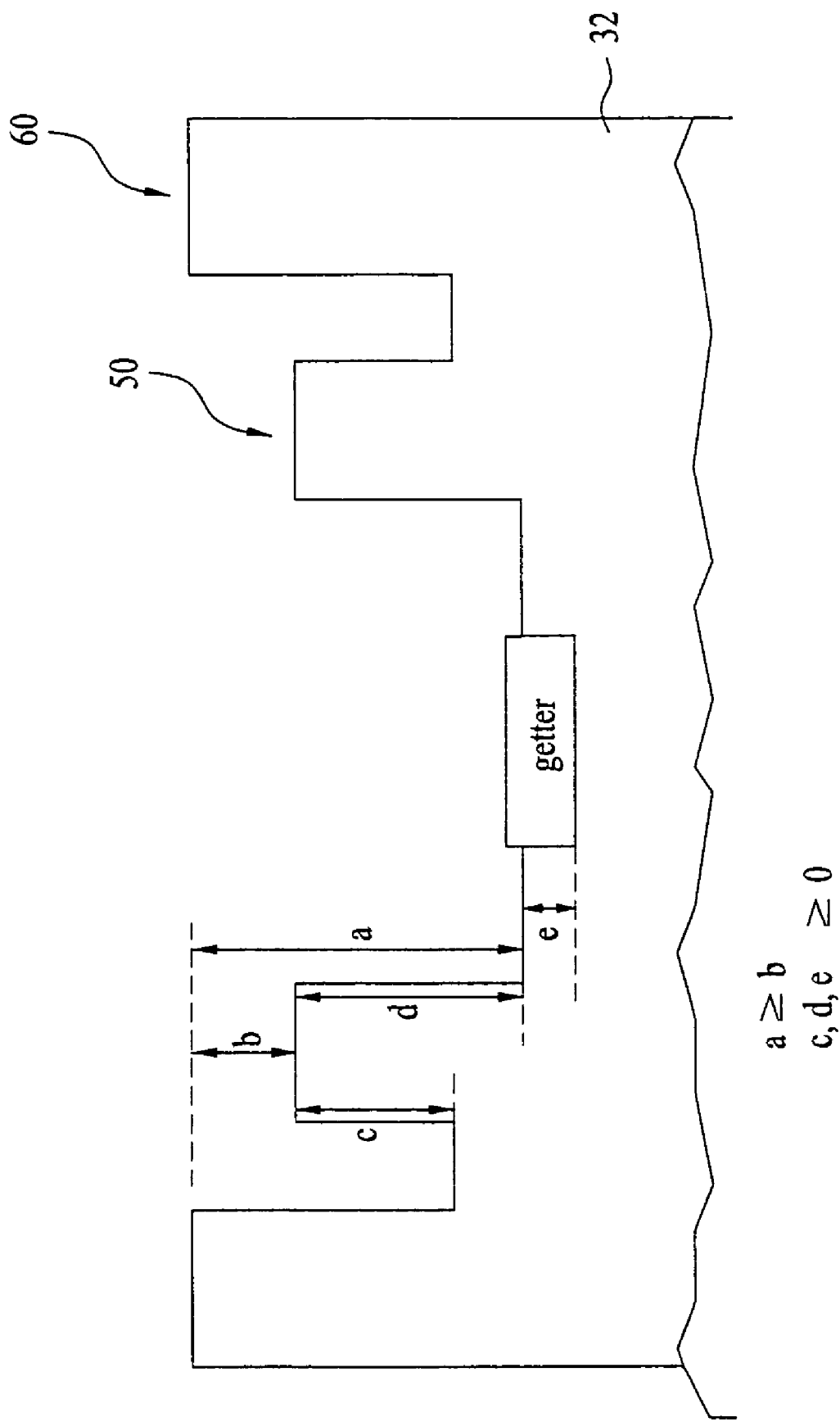

LIQUID CRYSTAL DISPLAY WITH ORGANIC EL BACKLIGHT COMPRISING CAP MEMBER WITH PROTRUSIONS

This application claims the benefit of the Korean Patent Application No. 10-2004-0055918, filed on Jul. 19, 2004, which is hereby incorporated by reference as if fully set forth herein.

BACKGROUND OF THE INVENTION

1. Field of the Invention

The present invention relates to a liquid crystal display, and more particularly, to a liquid crystal display and fabricating method thereof. Although the present invention is suitable for a wide scope of applications, it is particularly suitable for a liquid crystal display having a backlight.

2. Discussion of the Related Art

Recently, as the information-oriented society is developing, the demands for flat panel displays advantageous in lightweight, slim size and low power consumption gradually rise.

Among those flat panel displays, a liquid crystal display having excellent characteristics of resolution, color display, image quality and the like has been widely used for various fields of a TV monitor, a computer monitor and the like.

Specifically, an active matrix LED (AM-LED) stands in the spotlight for a liquid crystal display having excellent resolution and moving picture implementation capability.

A liquid crystal display generally consists of an upper substrate having a common electrode and a color filter, a lower substrate having a pixel electrode, and liquid crystals forming a liquid crystal layer provided between the upper and lower substrates.

Since the liquid crystals fail in emitting light, the liquid crystal display needs a separate light source.

The light source of the liquid crystal display is provided to a backside of a liquid crystal display panel and is called a backlight. And, the backlight is classified into a direct type and an edge type.

In the direct type, a backlight is placed under a liquid crystal display panel to illuminate a front side of the liquid crystal display panel. In the edge type, a backlight is provided to one side or both sides of a liquid crystal display panel to diffuse light in a manner that a light guide plate, a reflector and the like reflect the light.

And, the edge type backlight, of which volume can be reduced, is mainly used.

A liquid crystal display according to a related art is explained with reference to the attached drawing as follows.

FIG. 1 is a cross-sectional diagram of a liquid crystal display including an edge type backlight according to a related art.

Referring to FIG. 1, a liquid crystal display according to a related art mainly consists of a liquid crystal display panel 100 and a backlight 200.

The backlight 200 in the drawing is an edge type backlight. And, the backlight 200 consists of a light guide plate 16, a lamp 14 provided to one side of the light guide plate 16, and a lamp housing 12 enclosing the lamp 14 to direct light irradiated from the lamp 14 toward the light guide plate 16 entirely.

In this case, the light guide plate 16 plays a role in converting a linear light source to a surface light source so that the light irradiated from the lamp 14 can enter a front side of a liquid crystal display panel (not shown in the drawing). And, a multitude of dots 18 are provided to a bottom surface of the light guide plate 16.

A reflector 20 is additionally provided under the light guide plate 16 to prevent light leakage.

A diffusion plate 22, a pair of prism sheets 24a and 24b and a protective film 26 are sequentially provided over the light guide plate 16 to secure a viewing angle.

A multitude of triangular linear prisms are provided to each of the prism sheets 24a and 24b. And, the linear prisms of the prism sheet 24a are arranged vertical to those of the other prism sheet 24b.

However, the above-configured backlight of the related liquid crystal display needs many elements to be complicated, to have a thick volume and to cost much.

Moreover, the above-configured backlight of the related liquid crystal display needs the light guide plate to convert the linear light source to the surface light source, thereby having a considerable luminance difference.

SUMMARY OF THE INVENTION

Accordingly, the present invention is directed to a liquid crystal display and fabricating method thereof that substantially obviate one or more problems due to limitations and disadvantages of the related art.

An object of the present invention is to provide a liquid crystal display and fabricating method thereof, by which a backlight having a simple configuration, a reduced thickness and a low cost can be provided.

Another object of the present invention is to provide a liquid crystal display and fabricating method thereof, by which a backlight having almost no luminance difference can be provided.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a liquid crystal display according to the present invention includes a liquid crystal display panel having an upper substrate, a lower substrate and liquid crystals between the upper and lower substrates, an organic EL device provided under the lower substrate of the liquid crystal display panel to provide light to the liquid crystal display panel, and a cap boned to at least one of the lower substrate of the liquid crystal display panel and a substrate of the organic EL device to protect the organic EL device.

Preferably, the organic EL device includes a transparent substrate arranged under the lower substrate of the liquid crystal display panel, a first electrode formed on the transparent substrate, an organic EL layer formed on the first electrode, and a second electrode formed on the organic EL layer.

More preferably, the transparent substrate is formed of one selected from the group consisting of a polymer film, a multi-layer laminate film, an inorganic film, a multi-layer inorganic film and a multi-layer mixed film of laminate and inorganic films. More preferably, the first electrode is formed of one selected from the group consisting of a transparent conductive material of ITO, an organic material, a metal, an inorganic material, a mixture of at least two of the transparent conductive material, the organic material, the metal and the inorganic material. More preferably, the second electrode is formed of one selected from the group consisting of Mg—Ag, Al, a conductive metal layer, an alloy of at least two of the Mg—Ag, the Al and the conductive metal layer.

More preferably, the transparent substrate of the organic EL device and the lower substrate of the liquid crystal display panel are bonded to each other by an adhesive layer in-between.

Preferably, the liquid crystal display further includes a getter provided to a surface of the cap opposing the organic EL device to remove oxygen or moisture.

Preferably, the surface of the cap opposing the organic EL device is flat.

More preferably, the cap is bonded to the substrate of the organic EL device by a first adhesive agent and is bonded to a bottom of the lower substrate of the liquid crystal display panel by a second adhesive agent. More preferably, the first and second adhesive agents are formed of a same material or different materials, respectively. More preferably, each of the first and second adhesive agents includes one selected from the group consisting of a UV-hardening resin, a thermo-hardening resin and a mixture of the UV- and thermo-hardening resins.

Preferably, the cap includes a protrusion on a prescribed area of the surface opposing the organic EL device.

More preferably, the protrusion of the cap is bonded to the substrate of the organic EL device by a first adhesive agent and is bonded to a bottom of the lower substrate of the liquid crystal display panel by a second adhesive agent.

Preferably, the cap includes first and second protrusions on a prescribed area of the surface opposing the organic EL device.

More preferably, the first protrusion of the cap is bonded to the substrate of the organic EL device by a first adhesive agent and the second protrusion of the cap is bonded to a bottom of the lower substrate of the liquid crystal display panel by a second adhesive agent. More preferably, a height of the first protrusion of the cap is equal to or smaller than that of the second protrusion of the cap.

In another aspect of the present invention, a method of fabricating a liquid crystal display includes the steps of preparing a liquid crystal display panel having an upper substrate, a lower substrate and liquid crystals between the upper and lower substrates, preparing an organic EL device including a transparent substrate arranged under the lower substrate of the liquid crystal display panel, a first electrode formed on the transparent substrate, and an organic EL layer formed on the first electrode, primarily bonding a cap and the transparent substrate of the organic EL device so that the cap covers an upper part of the organic EL device, and secondarily bonding the cap primarily bonded to the transparent substrate of the organic EL device and the lower substrate of the liquid crystal display panel to each other.

Preferably, the step of primarily bonding the cap further includes the step of bonding the transparent substrate of the organic EL device and the lower substrate of the liquid crystal display panel.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 4 is a cross-sectional diagram of a cap of a liquid crystal display according to the present invention.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
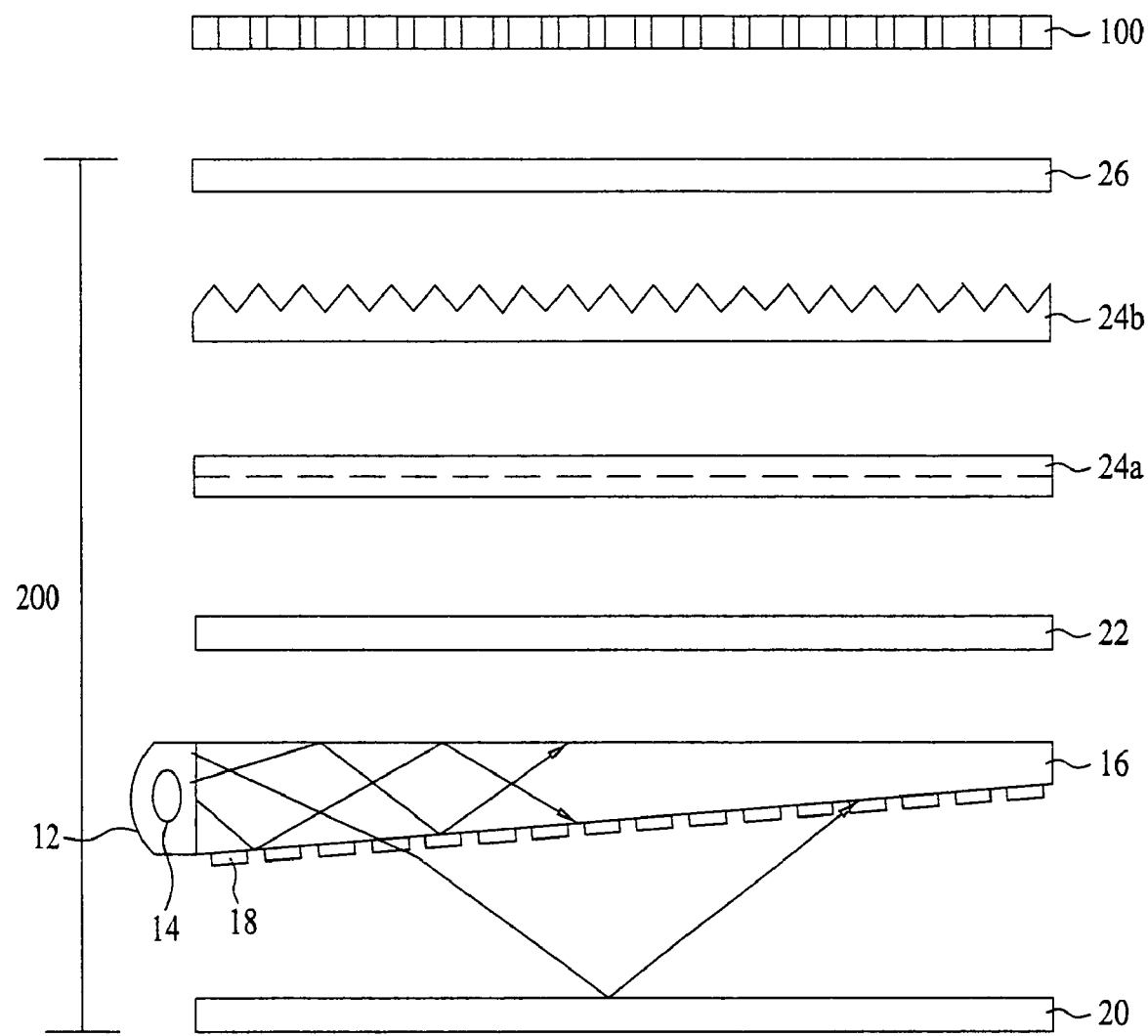
FIG. 1 is a cross-sectional diagram of a liquid crystal display including an edge type backlight according to a related art.
Figure 2:
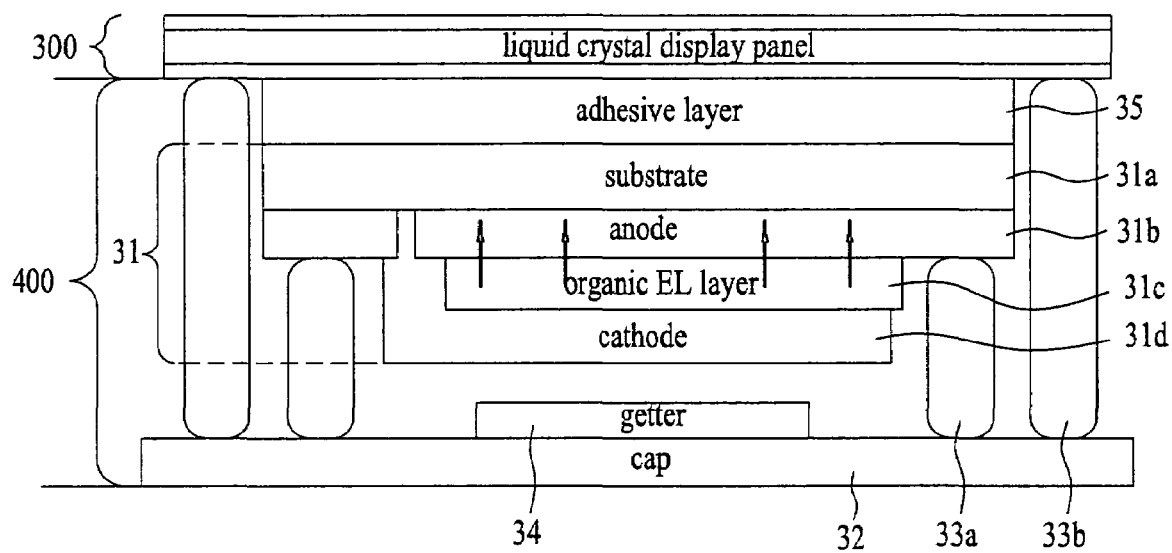
FIG. 2 is a cross-sectional diagram of a liquid crystal display according to the present invention.

FIG. 2 is a cross-sectional diagram of a liquid crystal display according to the present invention.

Referring to FIG. 2, a liquid crystal display according to the present invention includes a liquid crystal display panel 300 and a backlight 400 having an organic EL device 31 provided to a backside of the liquid crystal display panel 300 to directly illuminate the liquid crystal display 300 (direct type).

In this case, the liquid crystal display panel 300 includes an upper substrate, a lower substrate and a liquid crystal layer.

And, the organic EL device 31 is arranged under the lower substrate of the liquid crystal display panel 300 to provide light to the liquid crystal display panel 300.

Moreover, the organic EL device 31 includes a transparent substrate 31a arranged under the lower substrate of the liquid crystal display panel 300, a first electrode formed on the transparent substrate 31a, an organic EL layer formed on the first electrode 31b, and a second electrode 31d formed on the organic EL layer 31c.

In this case, the transparent substrate 31a is formed of a polymer film, a multi-layer laminate film, an inorganic film, a multi-layer inorganic film, a multi-layer mixed film of laminate and inorganic films, or the like.

The first electrode 31b is an anode formed of an transparent conductive material of ITO, an organic material, a metal, an inorganic material, a mixture of at least two of the former anode materials, or the like.

The second electrode 31d is a cathode formed of Mg—Ag, Al, a conductive metal layer, an alloy of at least two of the former cathode materials, or the like.

The transparent substrate 31a of the organic EL device 31 and the lower substrate of the liquid crystal display panel 300 can be bonded to each other by an adhesive layer 35.

To prevent an expected life span of the organic EL device 31 from being shortened by moisture permeation, a cap 32 can be provided to at least one of the lower substrate of the liquid crystal display panel 300 and the transparent substrate of the organic EL device 31.

A getter 34, which removes oxygen or moisture, can be provided to a surface of the cap 32 opposing the organic EL device 31.

And, the cap 32 of the present invention can be bonded to the liquid crystal display panel 300 and the organic EL device 31 in various ways.

FIGS. 3A to 3E are cross-sectional diagrams of various configurations of an organic EL device bonded to a cap of a liquid crystal display according to the present invention, respectively.

Figure 3A:
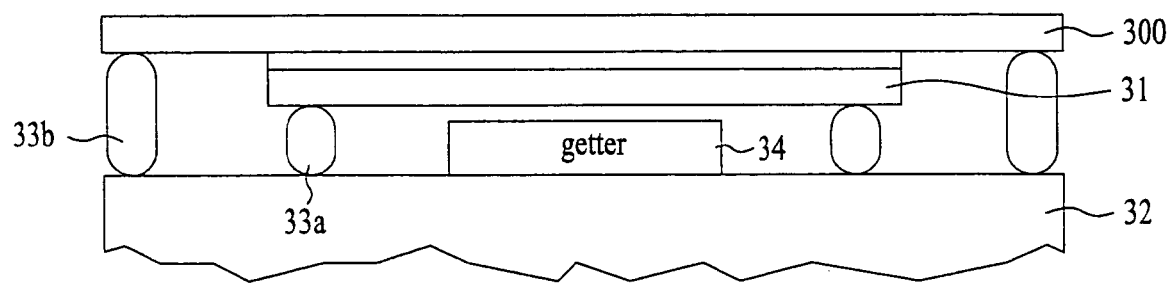
FIGS. 3A to 3E are cross-sectional diagrams of various configurations of an organic EL device bonded to a cap of a liquid crystal display according to the present invention, respectively.

Referring to FIG. 3A, a surface of a cap 32 opposing an organic EL device is flat. The cap 32 is bonded to the organic EL device by a first adhesive agent 33a and is bonded to a liquid crystal display panel 300 by a second adhesive agent 33b.

In this case, the first and second adhesive agents 33a and 33b may be the same material or may include different materials, respectively. Each of the first and second adhesive agents can be formed of a UV-hardening resin, a thermo-hardening resin, a mixture of them or the like.

Figure 3B:
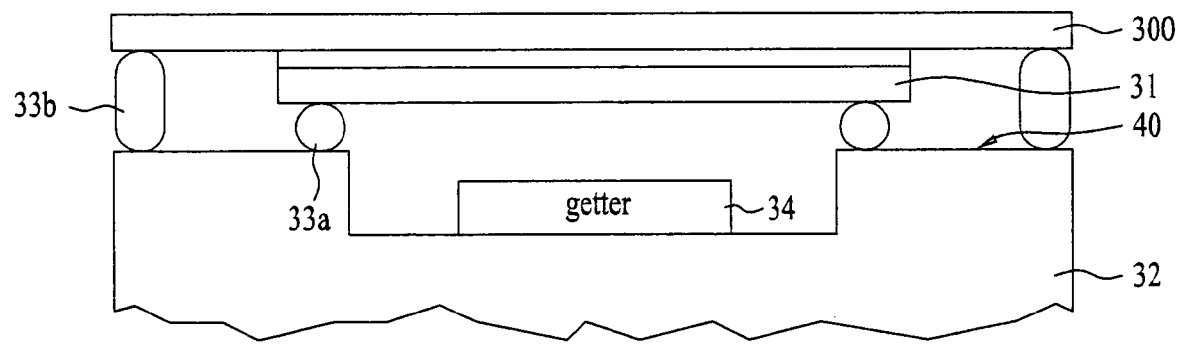

Referring to FIG. 3B, a cap 32 has a protrusion 40 on a prescribed area of a surface opposing an organic EL device 31. The protrusion 40 of the cap 32 is bonded to the organic EL device 31 by a first adhesive agent 33a and is bonded to a liquid crystal display panel 300 by a second adhesive agent 33b.

Figure 3C:
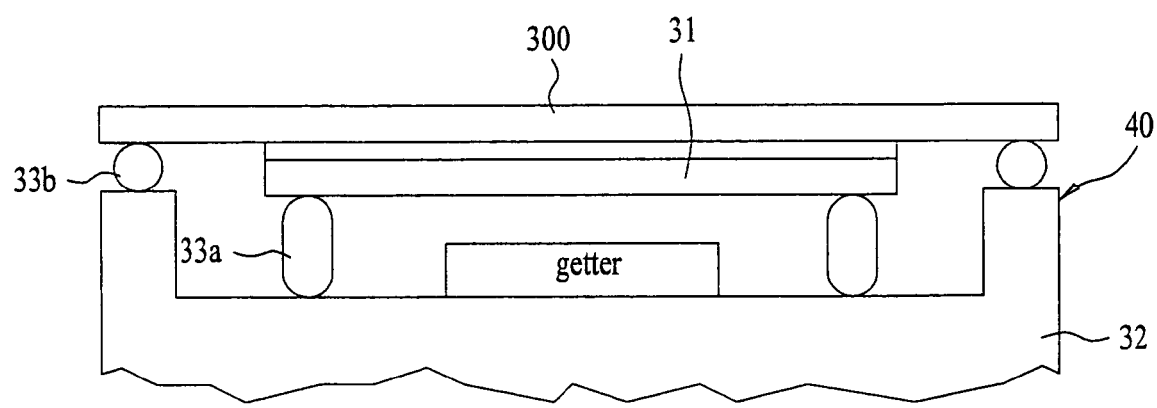

Referring to FIG. 3C, a cap 32 has a protrusion 40 on an edge area of a surface opposing an organic EL device 31. A surface of the cap 32 having not protrusion is bonded to the organic EL device 31 by a first adhesive agent 33a and the protrusion 40 is bonded to a liquid crystal display panel 300 by a second adhesive agent 33b.

Figure 3D:
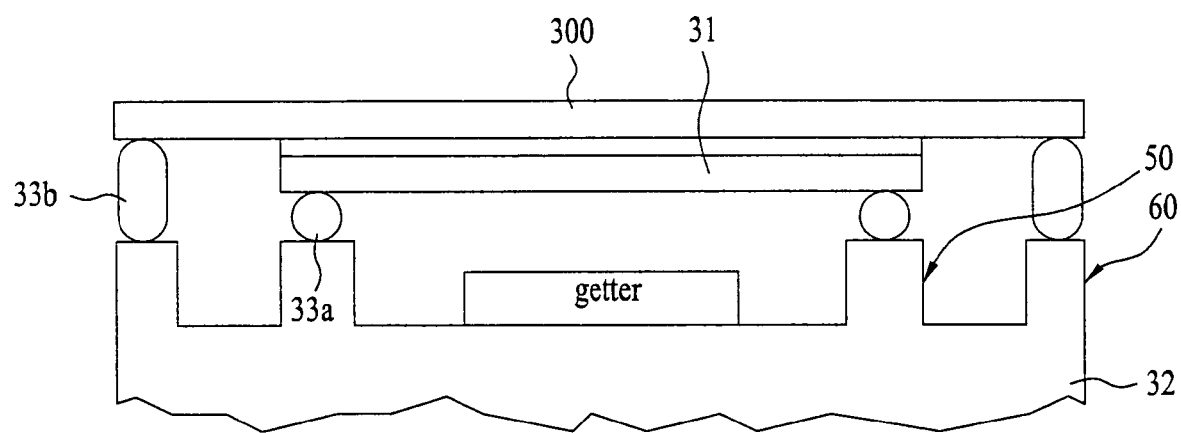
Figure 3E:
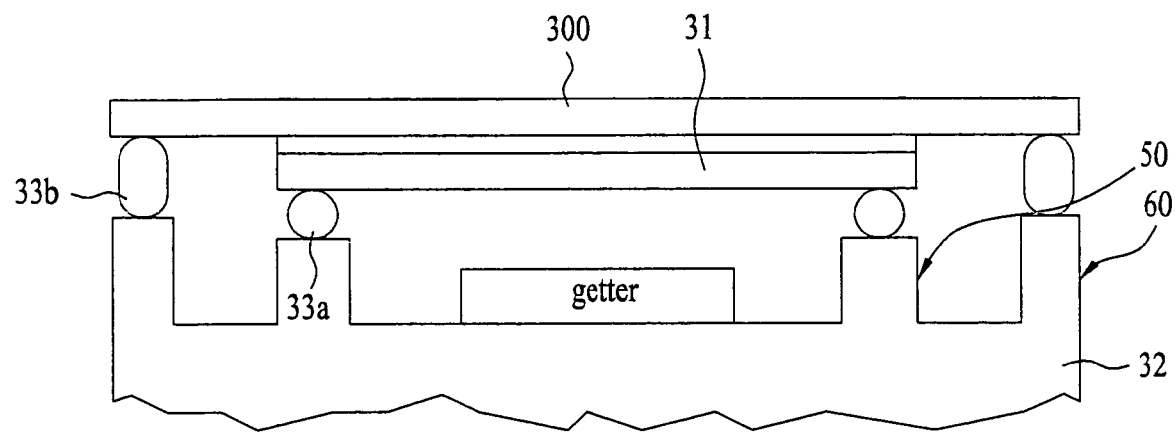

Referring to FIGS. 3D and 3E, a cap 32 has first and second protrusions 50 and 60 on a prescribed area of a surface opposing an organic EL device 31. The first protrusion 50 of the cap 32 is bonded to the organic EL device 31 by a first adhesive agent 33a and the second protrusion 60 of the cap 32 is bonded to a liquid crystal display panel 300 by a second adhesive agent 33b.

In particular, the first and second protrusions 50 and 60 of the cap 32 in FIG. 3D are equal to each other in height, whereas the first protrusion 50 of the cap 32 in FIG. 3E is lower than that of the second protrusion 60 of the cap 32 in FIG. 3E.

FIG. 4 is a cross-sectional diagram of a cap of a liquid crystal display according to the present invention.

Referring to FIG. 4, a cap 32 includes a first protrusion 50 and a second protrusion 60.

A relation between the first and second protrusions 50 and 60 can be represented by 'a≧b' and 'c, d, e≧0'.

A method of fabricating the above-configured liquid crystal display is explained with reference to the attached drawings as follows.

Figure 5A:
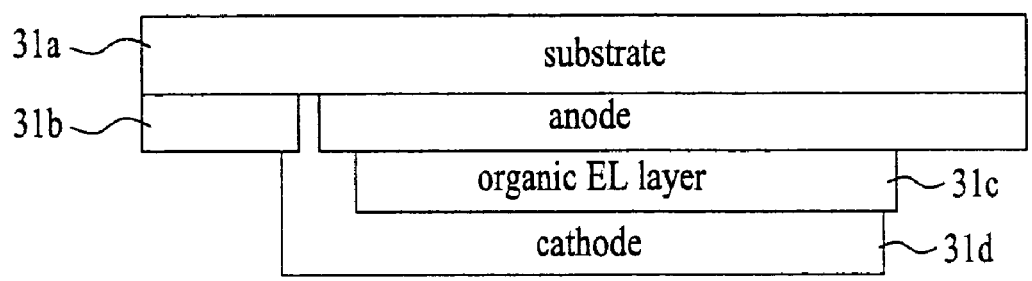
FIGS. 5A to 5C are cross-sectional diagrams of a method of fabricating a liquid crystal display according to the present invention.
Figure 5B:
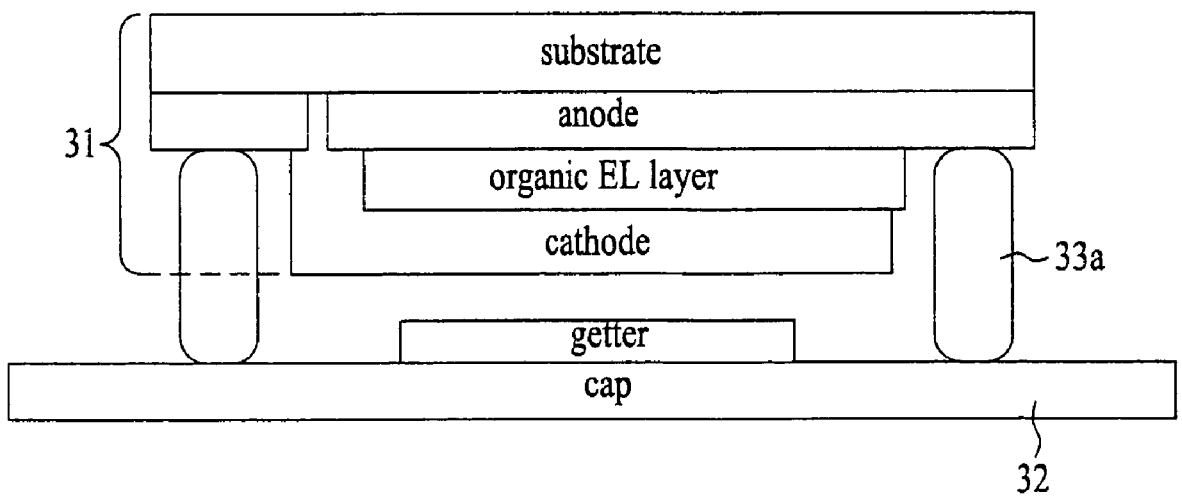
Figure 5C:
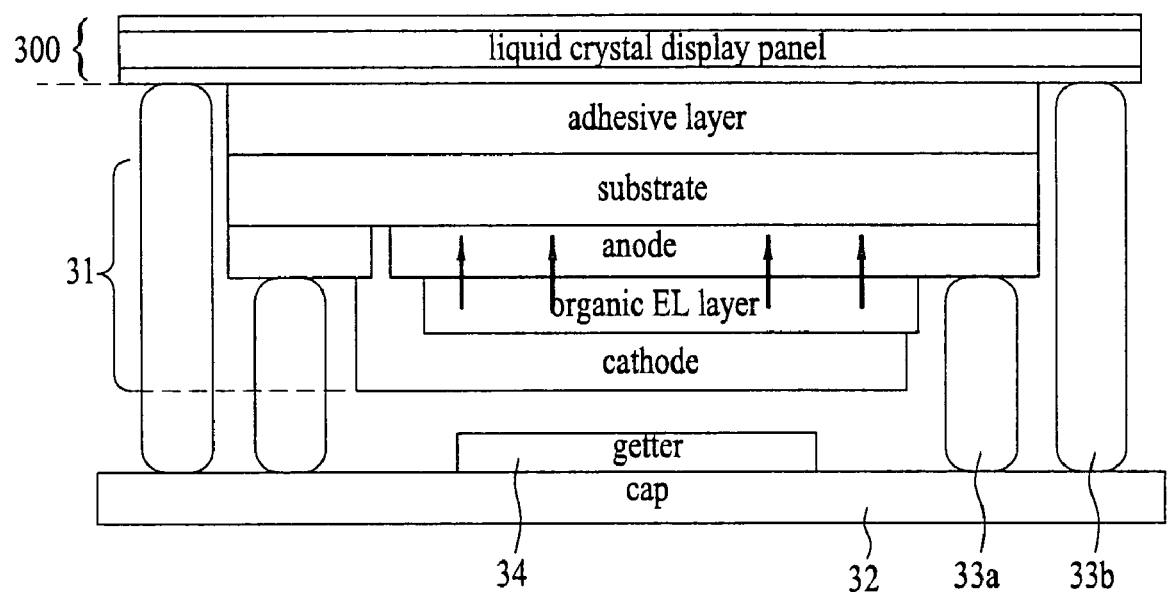

FIGS. 5A to 5C are cross-sectional diagrams of a method of fabricating a liquid crystal display according to the present invention.

Referring to FIG. 5A, first of all, a liquid crystal display panel including an upper substrate, a lower substrate and liquid crystals between the upper and lower substrates is prepared.

And, an organic EL device 31 is prepared. In this case, the organic EL device 31 includes a transparent substrate 31a as an anode, a first electrode 31b, an organic EL layer 31c and a second electrode 31d as a cathode.

Referring to FIG. 5B, a cap 32 and the organic EL device 31 are primarily bonded to each other by a first adhesive agent so that the cap 32 can cover an upper part of the organic EL device 31.

Referring to FIG. 5C, the cap 32 primarily bonded to the organic EL device 31 is secondarily bonded to a liquid crystal display panel 300 by a second adhesive agent 33b.

Optionally, the lower substrate of the liquid crystal display panel 300 can be further bonded to the organic EL device 31 prior to the secondary bonding process.

Accordingly, the present invention provides the following effects or advantages.

First of all, the light source implemented with the organic EL device is used as the backlight of the liquid crystal display, whereby the backlight can be provided without the related art light guide plate, polarizing plates, prism sheets and the like.

Therefore, the present invention enables the fabrication of the liquid crystal display having a simple configuration, a reduced thickness, a low cost and almost no luminance difference.

Secondly, by cutting off the moisture permeation in a manner of the double-bonding of the organic EL device, the expected device life span can be prevented from being reduced despite the substrate formed of the inorganic or polymer (laminate) material.

Therefore, the present invention enables the fabrication of the liquid crystal display having high efficiency and the long expected life span.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A liquid crystal display comprising:
a liquid crystal display panel having an upper substrate, a lower substrate and liquid crystals between the upper and lower substrates;
an organic EL device provided under the lower substrate of the liquid crystal display panel to provide light to the liquid crystal display panel; and
a cap having a plurality of protrusions on a surface opposing the organic EL device, wherein the plurality of protrusions are respectively bonded to a substrate of the organic EL device by a first adhesive agent and to a bottom of the lower substrate of the liquid crystal display panel by a second adhesive agent, and the substrate of the organic EL device is bonded to the lower substrate of the liquid crystal display panel by a third adhesive agent,
wherein the plurality of protrusions project toward a bottom of the substrate of the organic EL device and the bottom of the lower substrate of the liquid crystal display panel, respectively, and are spaced apart from one another by one or more predetermined distances, and wherein one lateral face of a first one of the protrusions is located apart from one lateral face of a second one of the protrusions adjacent to the first one of the protrusions,
wherein the first agent is located between the cap and a vicinity of an emitting area of the substrate of the organic EL device, the second agent is located between the cap and a vicinity of the third agent of the lower substrate of the liquid crystal display panel, and the third agent is located between the substrate of the organic EL device and the lower substrate of the liquid crystal display panel, the liquid crystal display further comprising:
a getter, wherein at least the first one of the protrusions bonded to the substrate of the organic EL device by the first adhesive agent and at least the second one of the protrusions bonded to the bottom of the lower substrate of the liquid crystal display panel by the second adhesive agent are located on a same side of the getter, and wherein the first and second ones of the protrusions are spaced apart from one another by said one or more predetermined distances.

2. The liquid crystal display of claim 1, wherein the substrate of the organic EL device is a transparent substrate arranged under the lower substrate of the liquid crystal display panel, and wherein the organic EL device further comprises:
   a first electrode formed on the transparent substrate;
   an organic EL layer formed on the first electrode; and
   a second electrode formed on the organic EL layer.

3. The liquid crystal display of claim 2, wherein the transparent substrate is formed of one selected from the group consisting of a polymer film, a multi-layer laminate film, an inorganic film, and a multi-layer inorganic film.

4. The liquid crystal display of claim 2, wherein the first electrode is formed of one selected from the group consisting of a transparent conductive material of indium tin oxide (ITO), an organic material, a metal, an inorganic material, a mixture of at least two of the transparent conductive material, the organic material, the metal and the inorganic material.

5. The liquid crystal display of claim 2, wherein the second electrode is formed of Mg—Ag, Al, a conductive metal, or an alloy of at least two of Mg—Ag, Al, or conductive metal.

6. The liquid crystal display of claim 1, wherein the getter is provided to a surface of the cap opposing the organic EL device to remove oxygen or moisture.

7. The liquid crystal display of claim 1, wherein the first, second, and third adhesive agents are formed of a same material.

8. The liquid crystal display of claim 1, wherein each of the first, second, and third adhesive agents comprises one selected from the group consisting of a UV-hardening resin, a thermo-hardening resin and a mixture of the UV- and thermo-hardening resins.

9. The liquid crystal display of claim 2, wherein the transparent substrate corresponds to the substrate of the organic EL device to which the protrusion is bonded.

10. The liquid crystal display of claim 1, wherein the first, second, and third adhesive agents are formed of different materials.

11. The liquid crystal display of claim 1, wherein the vicinity of the emitting area is within or adjacent to the emitting area of the substrate of the organic EL device, and wherein the vicinity of the third agent is adjacent to the third agent bonded to the lower substrate of the liquid crystal display panel.

12. The liquid crystal display of claim 1, wherein an electrode is located between the first adhesive agent and the substrate of the organic EL device.

13. The liquid crystal display of claim 1, wherein said one lateral face of the first one of the protrusions faces a first direction and said one lateral face of the second one of the protrusions faces a second direction opposing the first direction, and wherein the first and second ones of the protrusions do not contact one another.

14. The liquid crystal display of claim 13, wherein said one lateral face of the first one of the protrusions is separated from said one lateral face of the second one of the protrusions by an intervening surface of the cap, and wherein the intervening surface of the cap is lower than top surfaces of the first and second ones of the protrusions.

15. The liquid crystal display of claim 14, wherein the intervening surface of the cap faces the bottom of the substrate of the organic EL and the bottom of the lower substrate of the liquid crystal display panel.

16. The liquid crystal display of claim 1, wherein the plurality of protrusions project in a direction that is at least substantially perpendicular to at least one of the bottom of the substrate of the organic EL or the bottom of the lower substrate of the liquid crystal display panel.

17. The liquid crystal display of claim 1, wherein the first one of the protrusions which projects toward a bottom of the substrate of the organic EL device opposes a peripheral area surrounding a central area of the organic EL device on which a plurality of emitting pixels are formed, and wherein the second one of the protrusions which projects towards the bottom surface of the lower substrate of the liquid crystal display panel opposes a peripheral area surrounding a central area of the liquid crystal display panel on which a plurality of liquid crystals are formed, and
   wherein the first one of the protrusions is bonded to the peripheral area surrounding the central area of the organic EL device on which the plurality of pixels are formed, by the first agent, and wherein the second one of the protrusions is bonded to the peripheral area surrounding the central area of the liquid crystal display panel on which the plurality of liquid crystals are formed by the second agent.

18. The liquid crystal display of claim 17, wherein the first and second protrusions are spaced apart from each other by a predetermined distance so that one lateral face of the first protrusion does not contact one lateral face of the second protrusion opposing the one lateral face of the first protrusion.

19. A liquid crystal display, comprising:
   a liquid crystal display panel having an upper substrate, a lower substrate and liquid crystals between the upper and lower substrates;
   an organic EL device provided under the lower substrate of the liquid crystal display panel to provide light to the liquid crystal display panel; and
   a cap having a plurality of first protrusions and a plurality of second protrusions on a surface opposing the organic EL device, wherein the first protrusions of the cap are bonded to the substrate of the organic EL device by first adhesive agents and wherein the second protrusions of the cap are bonded to a bottom of the lower substrate of the liquid crystal display panel by second adhesive agents, and the substrate of the organic EL device is bonded to the lower substrate of the liquid crystal display panel by a third adhesive agent, wherein:
   the plurality of first protrusions and the plurality of second protrusions project toward a bottom of the substrate of the organic EL device and the bottom of the lower substrate of the liquid crystal display panel, respectively, and are spaced apart from each other by one or more predetermined distances, and one lateral face of each of the first protrusions is located apart from one lateral face of a respective one of the second protrusions,
   surfaces between the first and second protrusions and surfaces between the first protrusions are on different planes,
   wherein the first agents are located between the first protrusions of the cap and vicinities of an emitting area of the substrate of the organic EL device, the second agents are located between the second protrusions of the cap and vicinities of the third agent of the lower substrate of the liquid crystal display panel, and the third agent is located between the substrate of the organic EL device and the lower substrate of the liquid crystal display panel, the liquid crystal display further comprising:

a getter, wherein at least one of the first protrusions bonded to the substrate of the organic EL device by one of the first adhesive agents and at least one of the second protrusions bonded to the bottom of the lower substrate of the liquid crystal display panel by one of the second adhesive agents are located on a same side of the getter, and wherein the at least one first protrusion and the at least one second protrusion are spaced apart from one another by said one or more predetermined distances.

20. The liquid crystal display of claim 19, wherein heights of the first protrusions of the cap are equal to or smaller than that of the second protrusions of the cap.

21. The liquid crystal display panel of claim 19, wherein the vicinities of the emitting area are within or adjacent to emitting areas of the substrate of the organic EL device, and wherein the vicinity of the third agent is adjacent to the third agent bonded to the lower substrate of the liquid crystal display panel.

22. The liquid crystal display of claim 19, wherein an electrode is bounded by the first adhesive agents and the substrate of the organic EL device.

23. A method of fabricating a liquid crystal display, comprising:
preparing a liquid crystal display panel having an upper substrate, a lower substrate and liquid crystals between the upper and lower substrates;
preparing an organic EL device including a transparent substrate arranged under the lower substrate of the liquid crystal display panel, a first electrode formed on the transparent substrate, and an organic EL layer formed on the first electrode;
primarily bonding a cap and the transparent substrate of the organic EL device so that the cap covers an upper part of the organic EL device; and
secondarily bonding the cap primarily bonded to the transparent substrate of the organic EL device and the lower substrate of the liquid crystal display panel to each other,
wherein the cap is bonded to the transparent substrate of the organic EL device by first adhesive agents and to the lower substrate of the liquid crystal display panel by second adhesive agents, and the substrate of the organic EL device is bonded to the lower substrate of the liquid crystal display panel by a third adhesive agent, and wherein:
the cap has a plurality of first protrusions and a plurality of second protrusions formed on a surface opposing the organic EL device,
the pluralities of first and second protrusions project toward a bottom of the substrate of the organic EL device and a bottom of the lower substrate of the liquid crystal display panel, respectively, and are spaced apart from each other by at least one predetermined distance, and one lateral face of each of the first protrusions is located apart from one lateral face of respective ones of the second protrusions,
surfaces between the first and second protrusions and surfaces between the first protrusions are on different planes,
the first agents are located between the first protrusions of the cap and vicinities of an emitting area of the substrate of the organic EL device, the second agents are located between the second protrusions of the cap and vicinities of the third agent of the lower substrate of the liquid crystal display panel, and the third agent is located between the substrate of the organic EL device and the lower substrate of the liquid crystal display panel, the method further comprising:

forming a getter on a surface of the cap between the first protrusions,
wherein at least one of the first protrusions bonded to the substrate of the organic EL device by one of the first agents and at least one of the second protrusions bonded to the bottom of the lower substrate of the liquid crystal display panel by one of the second agents are located on a same side of the getter, and wherein the at least one first protrusion and the at least one second protrusion are spaced apart from one another by said one or more predetermined distances.

24. The method of claim 23, wherein primarily bonding the cap further comprises: bonding the transparent substrate of the organic EL device and the lower substrate of the liquid crystal display panel.

25. The method of claim 23, wherein the vicinities of the emitting area are within or adjacent to the emitting area of the substrate of the organic EL device, and wherein the vicinity of the third agent is adjacent to the third agent bonded to the lower substrate of the liquid crystal display panel.

26. The method of claim 23, wherein an electrode is bounded by the first adhesive agents and the substrate of the organic EL device.

27. The method of claim 23, wherein the at least one first protrusion is formed on a surface of the cap opposing a peripheral area surrounding a central area of the organic EL device on which a plurality of emitting pixels are formed, and the at least one second protrusion is formed on a surface of the cap opposing a peripheral area surrounding a central area of the liquid crystal display panel on which a plurality of liquid crystals are formed, and
wherein the at least one first protrusion is bonded to the peripheral area surrounding the central area of the organic EL device on which the plurality of emitting pixels are formed by a corresponding one of the first adhesive agents, and the at least one second protrusion is bonded to the peripheral area surrounding the central area of the liquid crystal display panel on which the plurality of liquid crystals are formed by a corresponding one of the second adhesive agents.

28. The method of claim 27, the first and second protrusions are spaced apart from each other by a predetermined distance so that one lateral face of said one of the first protrusions does not contact one lateral face of said one of the second protrusions opposing the one lateral face of said one of the first protrusions.

29. A liquid crystal display comprising:
a liquid crystal display panel having an upper substrate, a lower substrate and liquid crystals between the upper and lower substrates;
an organic EL device provided under the lower substrate of the liquid crystal display panel to provide light to the liquid crystal display panel; and
a cap having a first protrusion and a second protrusion, wherein the first protrusion is formed on a surface of the cap opposing a peripheral area surrounding a central area of the organic EL device on which a plurality of emitting pixels are formed, wherein the second protrusion is formed on a surface of the cap opposing a peripheral area surrounding a central area of the liquid crystal display panel on which a plurality of liquid crystals are formed, and
wherein the first protrusion is bonded to the peripheral area surrounding the central area of the organic EL device on which the plurality of emitting pixels are formed, by a first adhesive agent, and wherein the second protrusion is bonded to the peripheral area surrounding the central area of the liquid crystal display panel on which the plurality of liquid crystals are formed, by a second adhesive agent, the liquid crystal display further comprising:

a getter, wherein the first protrusion and the second protrusion are located on a same side of the getter and are spaced apart by a predetermined distance.

30. A method of fabricating a liquid crystal display, comprising:

preparing a liquid crystal display panel having an upper substrate, a lower substrate and liquid crystals between the upper and lower substrates;

preparing an organic EL device including a transparent substrate arranged under the lower substrate of the liquid crystal display panel, a first electrode formed on the transparent substrate, and an organic EL layer formed on the first electrode;

primarily bonding a cap and the transparent substrate of the organic EL device that the cap covers an upper part of the organic EL device; and secondarily bonding the cap primarily bonded to the transparent substrate of the organic EL device and the lower substrate of the liquid crystal display panel to each other, wherein the cap is bonded to the transparent substrate of the organic EL device by first adhesive agents and to the lower substrate of the liquid crystal display panel by second adhesive agents, and the substrate of the organic EL device is bonded to the lower substrate of the liquid crystal display panel by a third adhesive agent, wherein:

the cap has a first protrusion and a second protrusion, the first protrusion is formed on a surface of the cap opposing a peripheral area surrounding a central area of the organic EL device on which a plurality of emitting pixels are formed, and the second protrusion is formed on a surface of the cap opposing a peripheral area surrounding a central area of the liquid crystal display panel on which a plurality of liquid crystals are formed, the first protrusion is bonded to the peripheral area surrounding the central area of the organic EL device on which the plurality of emitting pixels are formed, by a first adhesive agent, and the second protrusion in bonded to the peripheral area surrounding the central area of the liquid crystal display panel on which the plurality of liquid crystals are formed, by a second adhesive agent, the method further comprising:

forming a getter on a surface of the cap, wherein the first protrusion and the second protrusion are located on a same side of the getter and are spaced apart by a predetermined distance.

* * * * *